(12) United States Patent
Pei et al.

(10) Patent No.: US 10,672,917 B2
(45) Date of Patent: Jun. 2, 2020

(54) SCHOTTKY BARRIER RECTIFIER

(71) Applicant: Gpower Semiconductor, Inc., Suzhou (CN)

(72) Inventors: Yi Pei, Suzhou (CN); Qiang Liu, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 15/637,585

(22) Filed: Jun. 29, 2017

(65) Prior Publication Data

US 2018/0158965 A1 Jun. 7, 2018

Related U.S. Application Data

(63) Continuation of application No. PCT/CN2017/083960, filed on May 11, 2017.

(30) Foreign Application Priority Data

Dec. 5, 2016 (CN) .......................... 2016 1 1102938

(51) Int. Cl.
*H01L 29/872* (2006.01)
*H01L 29/20* (2006.01)
*H01L 29/205* (2006.01)

(52) U.S. Cl.
CPC ...... *H01L 29/8725* (2013.01); *H01L 29/2003* (2013.01); *H01L 29/205* (2013.01)

(58) Field of Classification Search
None
See application file for complete search history.

(56) References Cited

U.S. PATENT DOCUMENTS

| | | | |
|---|---|---|---|
| 9,911,842 B2* | 3/2018 | Umeno | H01L 29/7787 |
| 2011/0297954 A1* | 12/2011 | Okamoto | H01L 29/08 257/76 |
| 2016/0118379 A1* | 4/2016 | Padmanabhan | H01L 27/0629 257/192 |
| 2016/0225889 A1* | 8/2016 | Umeno | H01L 29/47 |
| 2017/0047453 A1* | 2/2017 | Chu | H01L 29/872 |

* cited by examiner

*Primary Examiner* — Walter H Swanson
*Assistant Examiner* — Kien C Ly
(74) *Attorney, Agent, or Firm* — Flener IP & Business Law; Zareefa B. Flener

(57) ABSTRACT

The present disclosure provides a schottky barrier rectifier, comprising: a communication layer; a drift layer provided on a side of the communication layer and forming a heterojunction structure together with the communication layer; anode metal provided on a side of the drift layer away from the communication layer; and cathode metal provided on a side of the communication layer away from the drift layer. The drift layer is provided with a first area, which extends in a direction of thickness thereof, between a surface of the drift layer away from the communication layer and a surface thereof close to the communication layer, the first are a containing a first metal element and the content of the first metal element in the first area changing in the direction of thickness. The rectifier of the present disclosure uses polarized charges formed by a heterojunction, and thus the breakdown voltage of devices may be improved.

20 Claims, 5 Drawing Sheets

SCHOTTKY BARRIER RECTIFIER

CROSS-REFERENCE TO RELATED APPLICATIONS

The application is a continuation of International Application No. PCT/CN2017/083960, filed on May 11, 2017, which claims priority to Chinese Patent Application No. 201611102938.X, filed on Dec. 5, 2016, the disclosure of which is incorporated by reference herein in its entirety.

TECHNICAL FIELD

The present disclosure relates to the technical field of semiconductor devices, and in particular to a schottky barrier rectifier.

BACKGROUND

Wide bandgap semiconductor material represented by SiC and GaN has properties such as high breakdown field strength and excellent heat conductivity. With the development and popularization of the techniques in high-speed rails and electric motor train, there are increasing demands for power electronic devices with better performance. Thus, how to prepare power electronic devices which may operate under a higher voltage from wide band gap semiconductor material has also become a hot spot for research in the field of wide band gap semiconductor material.

SUMMARY

Accordingly, the present disclosure provides a schottky barrier rectifier by which the reverse breakdown voltage of electronic devices may be improved.

The present disclosure provides a schottky barrier rectifier, including: a communication layer; a drift layer provided on a side of the communication layer and forming a heterojunction structure together with the communication layer; anode metal provided on a side of the drift layer away from the communication layer; and cathode metal provided on a side of the communication layer away from the drift layer, wherein the drift layer is provided with a first area, which extends in the direction of thickness thereof, between a surface of the drift layer away from the communication layer and a surface thereof close to the communication layer, the first area containing a first metal element and the content of the first metal element in the first area changing in the direction of thickness.

It should be noted that the first area mentioned above is a structure with a certain length and located between two surfaces of the drift layer. Two ends of this first area in the direction of thickness each may be a part of the two surfaces of the drift layer, that is to say, both the two ends reach the two surfaces, or only one end reaches one of the two surfaces of drift layer; or, the two ends of this first area may be completely located within the two surfaces. Of course, the first area may be the whole drift layer, and the scope of the first area will not be explained in a limiting sense by those skilled in the art. In addition, the cross-section of the first area may be of any shapes.

Preferably, the content of the first metal element in the first area decreases from the side away from the communication layer to the side close to the communication layer.

Preferably, the content of the first metal element in the drift layer decreases from the side away from the communication layer to the side close to the communication layer.

Preferably, the content of the first metal element in the drift layer decreases in an n-order curve from the side away from the communication layer to the side close to the communication layer, wherein, n is a positive integer.

Preferably, the n-order curve is a quadratic curve or a cubic curve.

Preferably, the material of the drift layer includes AlGaN and the first metal element is an Al element; or, the material of the drift layer includes InGaN and the first metal element is an In element.

Preferably, the drift layer is made of AlGaN having a chemical formula of $Al_xGa_{1-x}N$, the first metal element is an Al element, and the depth of the drift layer from the side away from the communication layer to the side close to the communication layer is y; and, x and y satisfy the following function: $x=-ay^n+b$, where, a and b are constants greater than zero, n is greater than 1, and x ranges from 0 to 1.

Preferably, the schottky barrier rectifier further includes a first trench provided on a side of the drift layer away from the communication layer.

Preferably, the schottky barrier rectifier further includes filling material provided inside the first trench and being the same as the anode metal.

Preferably, the schottky barrier rectifier further includes filling material arranged inside the first trench, the filling material being one or a combination of Ti, Al, Ni, W, Au, Ag, Pt, Pb and TiN.

Preferably, the schottky barrier rectifier further includes an oxide liner layer provided between the trench and the filling material.

Preferably, the oxide liner layer is made of silicon oxide or silicon nitride.

Preferably, the communication layer includes a substrate, a buffer layer provided on a side of the substrate away from the cathode metal and a channel layer provided on a side of the buffer layer away from the substrate, and the channel layer forms the heterojunction structure together with the drift layer.

Preferably, the schottky barrier rectifier further includes a second trench running through the drift layer, the channel layer and the buffer layer, and a metal wiring layer, which electrically connects the communication layer and the substrate, is provided inside the second trench.

Preferably, the schottky barrier rectifier further includes an isolation filling layer provided inside the second trench and covering the metal wiring layer, and the drift layer and the metal wiring layer are isolated by the isolation filling layer.

Preferably, the communication layer includes a substrate close to the cathode metal and an epitaxial layer close to the drift layer.

Preferably, the epitaxial layer is made of lightly-doped GaN.

Preferably, a side of the substrate close to the epitaxial layer is made of N-type doped GaN.

Preferably, the drift layer includes a charge layer close to the epitaxial layer and a capping layer away from the epitaxial layer.

Preferably, the charge layer is made of AlGaN, and the capping layer is a single-layer structure or a multi-layer structure consisted of any one or a combination of GaN, AlGaN, InGaN and AlN.

Compared with the prior art, the schottky barrier rectifier provided in the embodiments of the present disclosure at least has the following advantages.

With regard to the schottky barrier rectifier in the embodiments of the present disclosure, by using AlGaN material with Al content being gradually changed in the direction of thickness, a polarized charge area which is distributed in gradient in the direction of thickness of the drift layer is generated inside the drift layer, so that the distribution of the electric field in the drift layer becomes smooth, and the voltage withstanding performance of the rectifier is further improved.

With regard to the schottky barrier rectifier provided in the embodiments of the present disclosure, conduction is realized by carriers generated by the ionization of polarized charges. That is to say, charges may be ionized without activation energy. Accordingly, the schottky barrier rectifier may operate at a relatively low temperature.

With regard to the schottky barrier rectifier provided in the embodiments of the present disclosure, by a metal oxide trench design, apposition in the drift layer with the strongest electric field when a reverse voltage is withstood is shifted from the schottky barrier to the bottom of the trench. In this way, the breakdown voltage of the rectifier is improved.

BRIEF DESCRIPTION OF DRAWINGS

In order to describe the technical solutions of the embodiments of the present disclosure more clearly, accompanying drawings to be used in the embodiments will be briefly introduced below. It should be understood that the drawings below merely show some embodiments of the present disclosure and thus cannot be considered as limitations to the scope. A person of ordinary skill in the art may also obtain other relevant drawings according to these drawings without paying any creative effort.

DETAILED DESCRIPTION

Figure 1:
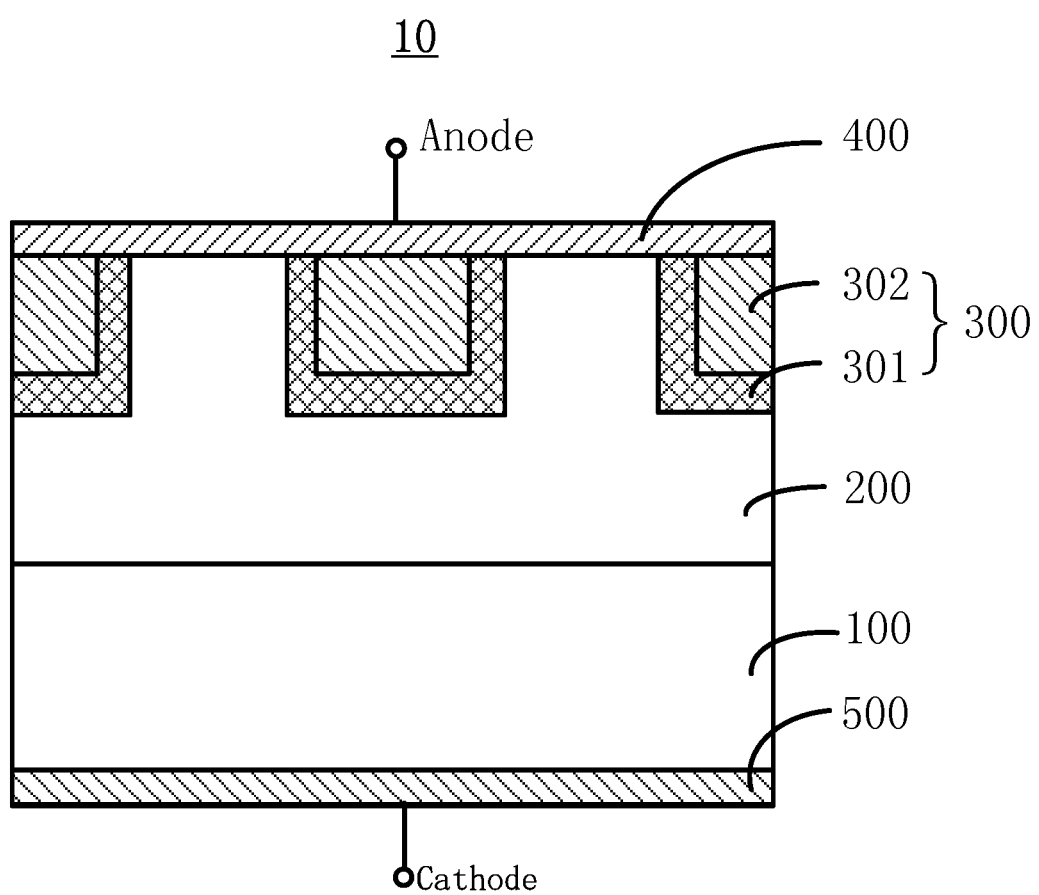
FIG. 1 is a schematic structure diagram of a schottky barrier rectifier according to the first embodiment of the present disclosure.

Technical solutions in the embodiments of the present disclosure will be described clearly and completely with reference to the accompanying drawings in the present disclosure. Apparently, the embodiments described herein are merely some but not all the embodiments of the present disclosure. In general, the assemblies in the embodiments of the present disclosure described and shown in the drawings herein may be arranged and designed in different configurations. The detailed description of the embodiments of the present disclosure as provided in the drawings below is not intended to limit the protection scope of the present disclosure, but merely to denote the selected embodiments of the present disclosure. Based on the embodiments of the present disclosure, all other embodiments obtained by those skilled in the art without paying creative effort belong to the protection scope of the present disclosure.

It should be noted that like reference characters and letters denote like items in the following drawings. Thus, once a certain item is defined in one drawing, there is no need to define and explain it again in the subsequent drawings. Meanwhile, in the description of the present disclosure, terms "first", "second", etc. are merely used for differentiating, and cannot be interpreted to indicate or imply any relative importance.

With regard to semiconductor material, ion implantation is generally used to adjust resistance in different areas thereof. By introducing impurities in a shallow energy level into the selected areas, carriers may be generated by ionization of semiconductor material at normal temperature. In this way, the resistance of the semiconductor material in different area is adjusted. In addition, after the carriers in these doped areas are depleted in an electric field, a built-in electric field which is opposite to the direction of the electric field may be generated by space charges generated by remaining ionized impurities. In this way, more evenly distributed electric field may be obtained by adjusting distribution of ion-doping concentration, and the breakdown voltage of semiconductor devices may thus be improved.

As for semiconductors prepared from material such as GaN, there are two problems in such a process of implanting impurities in a shallow energy level. One is that a very high annealing temperature is required by a large quantity of lattice damages resulted from the implantation; however, the surface properties of GaN will be degraded at such a high temperature, and the device performance is thus influenced. The other is that the activation rate of ions annealed after the process of implanting and annealing is quite low, and consequently, a desired doping concentration cannot be effectively obtained by the implantation process. The two technical problems restrict the application of a shallow energy level implantation process in, for example, designing GaN devices.

To solve the problem in the shallow-energy-level doping process of material such as GaN, a new technical solution is used in the present disclosure to replace the shallow-energy-level implantation process, so that technical problems caused by annealing at a high temperature may be avoided. For example, in a heterojunction structure formed by AlGaN and GaN, for example, the Al component in AlGaN may be allowed to change successively within a certain area, so that polarized charges distributed gradiently may be formed inside this area, and electron distribution similar to 2D electron gas may be further generated inside the area of the AlGaN/GaN heterojunction structure. Such polarized charges can, for example, not only modulate the resistivity of the semiconductor material, but also serve as space charges to withstand a voltage in an electric field. Compared with carriers introduced by shallow-energy-level doping, the electrons introduced by the polarized charges of the embodiments in the present disclosure may be located in, for example, a conduction band, so that additional activation energy is not required. Thus, the schottky barrier rectifier in some embodiments of the present disclosure may operate at a relatively low temperature without a carrier freeze-out effect. In this way, the rectifier may operate at a relatively low temperature.

With regard to the GaN-based schottky barrier rectifier of the embodiments in the present disclosure, a space polarized charge area is introduced in the drift layer, and the breakdown voltage of the semiconductor devices is thus improved. In addition, some schottky barrier rectifiers in some embodiments of the present disclosure adopt the design structure of a metal oxide trench, and the Al component in the heterojunction structure is modulated, so that the schottky barrier rectifiers in some embodiments of the present disclosure may have advantages such as high reverse breakdown voltage and operation under low temperature.

Before the description of specific embodiments, it should be noted that, in the specific implementation of the present disclosure, the metal oxide trench corresponds to the first trench and the cathode trench corresponds to the second trench. For the purpose of clarity, embodiments will be described below by taking metal oxide trenches and cathode trenches as examples. In addition, it should be appreciated by those skilled in the art that the thickness direction of the drift layer is consistent to that of the depth thereof. The depth in the description is the distance from a surface on a side of the drift layer away from the communication layer to the interior of the drift layer. For example, the depth of the surface on the side of the drift layer away from the communication layer is zero; and correspondingly, the distance from the surface on the side of the drift layer away from the communication layer to a surface on a side of the drift layer close to the communication layer is the maximum depth.

In addition, because a position in the drift layer having the strongest electric field is typically at a surface schottky barrier, when a reverse voltage is applied, device failure may be caused due to the breakdown of the schottky barrier. In the rectifier of the present disclosure, a metal oxide trench design is used, so that the position in the drift layer having the strongest electric field when a reverse voltage is applied is shifted from the schottky barrier to the bottom of the trench. In this way, the schottky barrier in the rectifier of the present disclosure may withstand a higher voltage, and the overall breakdown voltage of the rectifier in the present disclosure is thus improved.

Further, after the metal oxide trench is introduced, the breakdown voltage of the drift layer will be restricted due to the voltage withstanding limit of oxides in the metal oxide trench because the strongest electric field appears at the bottom of the trench. In the present disclosure, due to the advantage that it is easy to modulate the concentration of the polarized charges generated by the AlGaN/GaN hetereojunction structure having a varying Al component, the Al component in the AlGaN/GaN heterojunction structure is modulated by a quadratic function, and thus the generated polarized charges gradually rise in the direction of depth. By the introduction of such a design, the distribution of the electric filed inside the drift layer may become very smooth without obvious peaks, so that the voltage withstanding limit of oxides in the metal oxide trench will no longer restrict the breakdown voltage of the devices. In this way, the breakdown voltage of the rectifier may be further improved.

Thus, compared with rectifiers of the same kind, the GaN-based schottky barrier rectifier provided in the embodiments of the present disclosure, by using a space polarized charge area as a drift layer, employing a design structure with a metal oxide trench, and modulating the Al component in the heterojunction structure, has advantages such as high reverse breakdown voltage and operation under low temperature.

Embodiment 1

The structure of a schottky barrier rectifier 10 according to embodiments of the present disclosure is shown in FIG. 1. The schottky barrier rectifier 10 includes a communication layer 100, a drift layer 200 provided on a side of the communication layer 100, a metal oxide trench 300 provided on a side of the drift layer 200 away from the communication layer 100, anode metal 400 in schottky contact with the drift layer 200, and cathode metal 500 in Ohm contact with the communication layer 100.

The communication layer 100 may be an N-type doped GaN substrate or may be obtained by heterogeneous epitaxy of a non-GaN substrate. For example, the communication layer 100 may be obtained by heterogeneous epitaxy by using any one of sapphire, SiC, Si, $LiNbO_3$, SOI (Silicon-on-insulator), or AlN as the substrate. Material of the heteroepitaxial GaN layer is, for example, the N-type doped GaN. If a non-GaN substrate is used in the structure of the aforementioned communication layer 100, after the structure of the front side (the side of the communication layer away from the cathode metal) of the device is formed, this heterogeneous substrate is to be removed by thinning so as to expose the heavily-doped N-type GaN substrate. In this way, the cathode metal 500 is deposited on the exposed N-type GaN substrate. The communication layer 100 has a thickness of 1 μm to 1 cm and a doping concentration of $10^{10}$ $cm^{-3}$ to $10^{23}$ $cm^{-3}$. In this embodiment, the communication layer 100 is an N-type GaN substrate, and has a doping concentration of $10^{19}$ $cm^{-3}$.

The drift layer 200 forms a heterojunction structure together with the communication layer 100 located on a side of the drift layer 200 away from the anode metal 400. The material of the drift layer 200 may be AlGaN, InGaN or other material which may form a heterojunction channel together with GaN. The drift layer 200 has a thickness of 100 nm to 100 μm and a doping concentration of $10^{10}$ $cm^{-3}$ to $10^{23}$ $cm^{-3}$.

The drift layer 200 in this embodiment is non-doped $Al_xGa_{1-x}N$ material. For example, the Al component x in $Al_xGa_{1-x}N$ may be changed according to any modulation function in the direction of depth (i.e., the direction of thickness of the drift layer). In one embodiment of the present disclosure, the drift layer 200 has a thickness of 2 μm, and the Al component in the direction of depth changes according to the rule of the preset modulation function shown in FIG. 2. The energy band structure and the distribution of polarized charges of device in this embodiment in the direction of depth are shown in FIG. 3.

Figure 2:
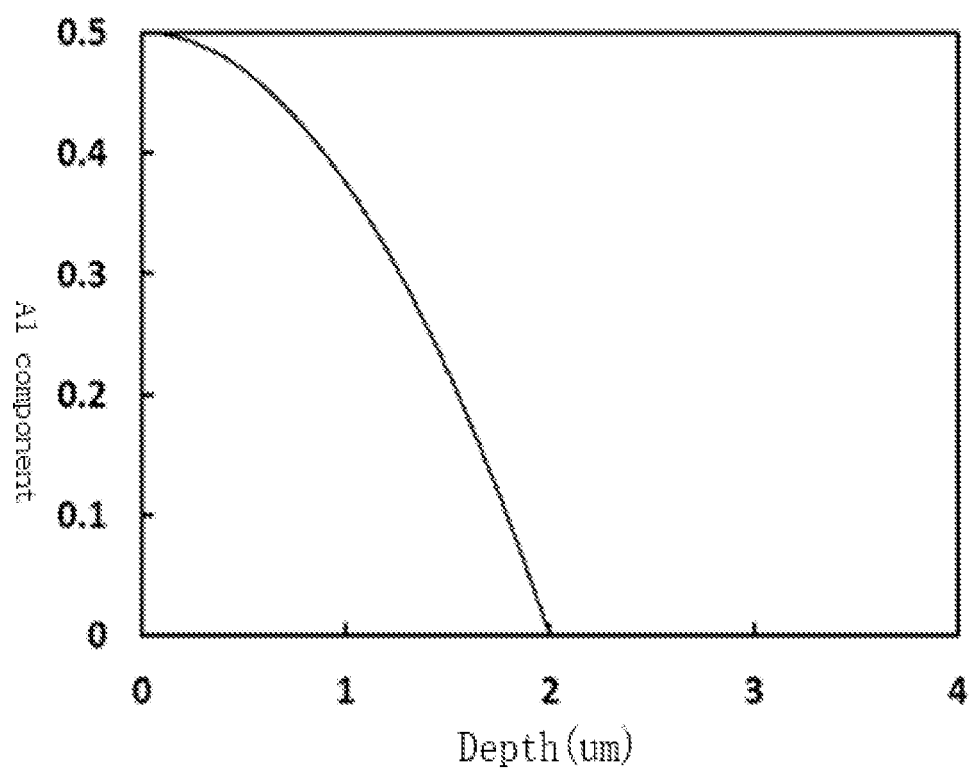
FIG. 2 is a schematic view illustrating the distribution of the Al component in the drift layer of the schottky barrier rectifier according to the first embodiment of the present disclosure.
Figure 3:
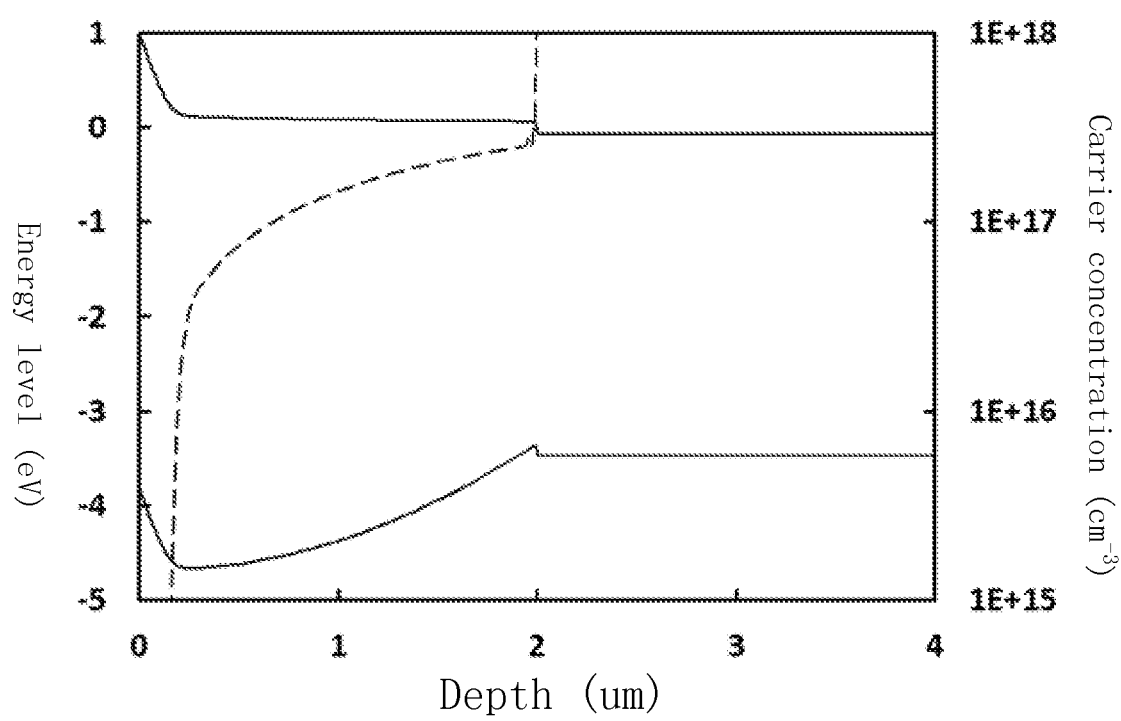
FIG. 3 is a schematic structure diagram of the energy band of the schottky barrier rectifier according to embodiments of the present disclosure.

Still referring to FIG. 2, for example, the depth of a side of the drift layer away from the communication layer toward the communication layer and to the interior of the drift layer is y, and x and y may fulfill the following relation, $x=-ay^n+b$, where, a and b are constants greater than zero; n is greater than zero, and more preferably, n is greater than 1; and x ranges from 0 to 1, and the value of y changes between 0 and the thickness value of the drift layer. It can be known from this function formula that, when n is equal to 1, the change of x along the depth y decreases linearly. When n is not equal to 1, the change of x along the depth y decreases curvedly. For example, the curve function may be a quadratic function or a cubic function. When the change of x along with y shows a quadratic curve relation or a cubic curve relation, the distribution of the electric field inside the drift layer may become more smooth without obvious peaks, and the breakdown voltage of the devices is further improved. In addition, it can also be concluded from the above function that the Al component decreases as the depth y increases. That is to say, the content of Al in the drift layer gradually decreases from a surface on the side away from the communication layer to a surface on a side close to the communication layer. For example, the drift layer may not contain Al element on the surface of the side close to the communication layer.

For example, firstly, a metal oxide trench 300 may be prepared by etching the drift layer 200. This trench has a thickness not greater than, for example, the thickness of the drift layer 200. Then, an oxide liner layer 301 and a filling layer 302 may be successively deposited in the formed trench.

The oxide liner layer 301 may be one of $Si_xO_y$, $Si_xN_y$, and other similar material, where x, y are positive numbers.

The filling layer 302 is made of metal, for example, being the same material as the anode metal 400; or, the filling layer 302 may be made of one of Ti, Al, Ni, W, Au, Ag, Pt, Pb, TiN and other similar material or a combination thereof.

The anode metal 400 is located on a surface on a side of the drift layer 200 away from the communication layer 100. The anode metal 400 forms a schottky barrier together with the AlGaN material of the drift layer 200. This anode metal 400 may be made of one of Ti, Al, Ni, W, Au, Ag, Pt, Pb, TiN and other similar material or a combination thereof, or may be made of a metal layer having a composite structure.

The cathode metal 500 is located on a surface on a side of the communication layer 100 away from the drift layer 200. For example, this cathode metal 500 is in Ohm contact with, for example, N-type low-resistance material of the communication layer 100. This cathode metal 500 may be made of one of Ti, Al, Ni, W, Au, Ag, Pt, Pb, TiN and other similar material or a combination thereof, or may be made of a metal layer having a composite structure.

Since a position in the drift layer with the strongest electric field is typically at the surface of a schottky barrier, when a reverse voltage is withstood, device failure may be caused due to the breakdown of the schottky barrier. In the rectifier of one embodiment of the present disclosure, a metal oxide trench design is used, so that a position in the drift layer having the strongest electric field when voltage is withstood reversely is shifted from the schottky barrier to the bottom of the trench. In this way, the schottky barrier of the rectifier in the present disclosure may withstand a higher voltage, and the overall breakdown voltage of the rectifier is thus improved.

In addition, in the embodiments of the present disclosure, although the voltage withstanding performance of the devices may be improved to some extent by introducing a metal oxide trench to a side of the drift layer away from the communication layer, the improvement on the voltage withstanding performance of the devices may be restricted due to the voltage withstanding limit of oxides in the metal oxide trench. Meanwhile, in the schottky barrier rectifier in one embodiment of the present disclosure, due to the advantage that it is easy to modulate the concentration of the polarized charges generated by the AlGaN/GaN hetereojunction structure having a varying Al component, the Al component in the AlGaN/GaN heterojunction structure are modulated by a modulation function (for example, a quadratic function), and thus the generated polarized charges gradually decrease in the direction of depth. In such a way of modulating the polarized charges, the distribution of the electric field inside the drift layer may become very smooth without obvious peaks, so that the voltage withstanding limit of oxides in the metal oxide trench will no longer restrict the voltage withstanding performance of the devices. The reverse breakdown voltage of the rectifier may be further improved by the gradually-changing polarized charge concentration and the use of the metal oxide trench.

Embodiment 2

Figure 4:
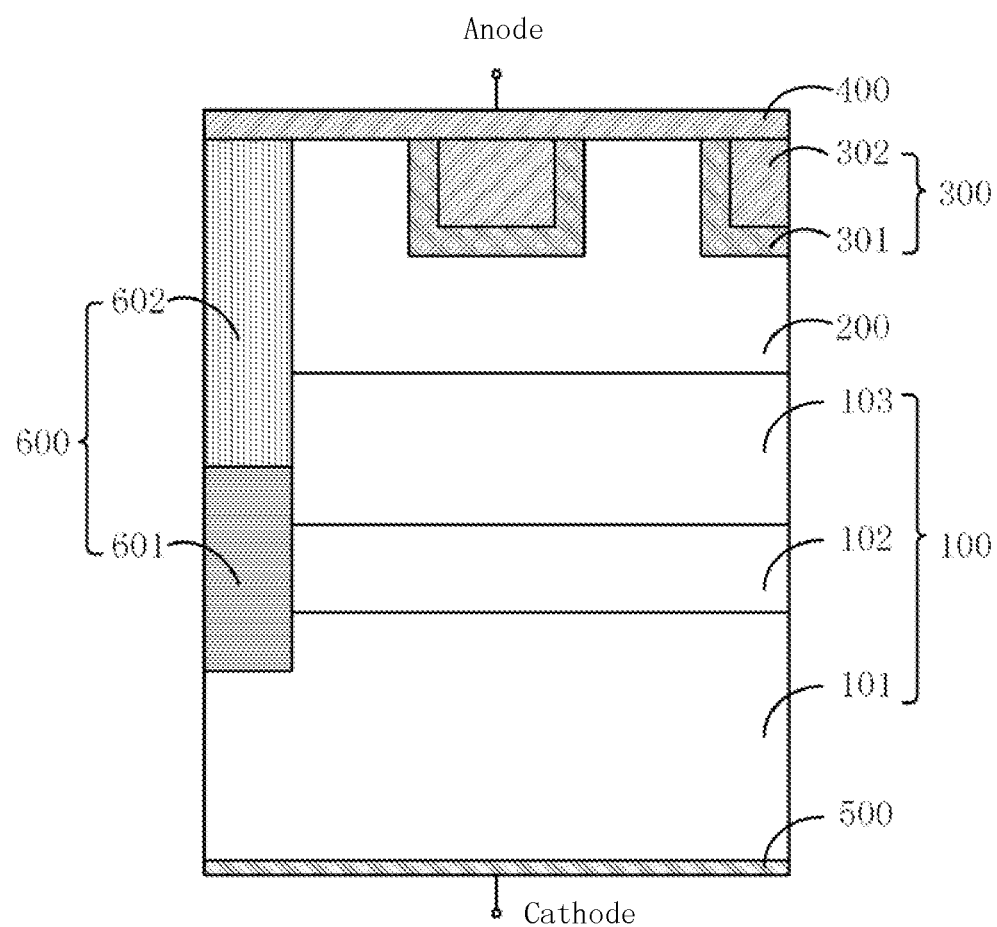
FIG. 4 is a schematic structure diagram of another schottky barrier rectifier according to the second embodiment of the present disclosure.

In order to lower the cost for manufacturing power devices, an Si substrate is used in the communication layer in this embodiment of the present disclosure, and a semi-vertical structure design is introduced, so that a substrate-thinning process is omitted and the processing steps are thus simplified. The Embodiment 2 is a variant of the Embodiment 1, and the structure of the Embodiment 2 is shown in FIG. 4. A schottky barrier rectifier 20 includes a communication layer 100, a drift layer 200, a metal oxide trench 300, anode metal 400 in schottky contact with the drift layer 200, cathode metal 500 in Ohm contact with the communication layer 100, and a cathode trench 600. The main variance of the Embodiment 2 with respect to the Embodiment 1 lies in the structure of the communication layer 100 and the additional arrangement of the cathode trench 600.

The communication layer 100 in this embodiment includes a substrate 101, a buffer layer 102 and a channel layer 103. The buffer layer 102 is arranged on a side of the substrate 101 away from the cathode metal 500, and the channel layer 103 is arranged on a side of the buffer layer 102 away from the substrate 101. The channel layer 103 forms a heterojunction structure together with the drift layer 200.

The substrate 101 may be made of any one of Si, sapphire, SiC, $LiNbO_3$, SOI or AlN. The substrate 101 has a thickness of 1 μm to 1 cm and a doping concentration of $10^{10}$ $cm^{-3}$ to $10^{23}$ $cm^{-3}$.

For example, the buffer layer 102 may be made of AlN, AlGaN or GaN. For example, the buffer layer 102 may be a single-layer structure or a multi-layer structure formed of any one or a combination of AlN, AlGaN and GaN. For example, the buffer layer 102 may has a thickness of 1 nm to 10 μm and a doping concentration of $10^{10}$ $cm^{-3}$ to $10^{23}$ $cm^{-3}$. Lattice mismatch between the substrate 101 and the channel layer 103 may be reduced by providing the buffer layer 102, and the crystalline quality of the channel layer 103 may be thus improved.

For example, the channel layer 103 may be made of one of GaN, AlGaN and InGaN or any combination thereof. For example, the channel layer 103 may be a single-layer structure or a multi-layer structure. The channel layer 103 forms a heterojunction structure together with the drift layer 200, and polarized charges are formed in the drift layer 200. For example, the channel layer 103 may have a thickness of 1 nm to 100 nm and a doping concentration of $10^{10}$ $cm^{-3}$ to $10^{23}$ $cm^{-3}$.

For example, in order to form the cathode trench 600, first, a trench with a depth far to the substrate 101 may be formed on a side of the drift layer away from the communication layer by etching, and then a metal wiring layer 601 and an isolation filling layer 602 are successively deposited. Equivalently, the trench 600 running through the drift layer 200, the channel layer 103 and the buffer layer 102 is formed by etching. In this case, that is to say, a portion of the substrate 101 may be exposed from a side of the trench 600 close to the substrate 101, so that the metal wiring layer 601 may be formed by filling metal in the trench 600. It should be noted that a side of the metal wiring layer 601 away from the substrate 101 is, for example, out of contact with the drift layer 200, so that the metal wiring layer 601 and the drift layer 200 are isolated by covering the isolation filling layer 602 on a side of the metal wiring layer 601 away from the substrate 101.

An N-type GaN layer and a Si substrate 101 may be electrically communicated by the above metal wiring layer 601. For example, the metal of the metal wiring layer 601 may be selected from one of Ti, Al, Ni, W, Au, Ag, Pt, Pb, TiN and other similar material, or may be a metal layer having a composite structure.

The metal wiring layer 601 and the drift layer 200 may be electrically isolated by the above isolation filling layer 602. The isolation filling layer 602 may be made of, for example, one of silicon oxides such as SiO, silicon nitrides such as SiN and other similar material. It has to be noted that the proportion of silicon to oxygen in the silicon oxides may be different and the proportion of silicon to nitrogen in the silicon nitrides may be different as well.

In this embodiment, by designing the communication layer as a structure having a substrate, a buffer layer and a channel layer, lattice mismatch between the substrate and the channel layer may be reduced, the crystalline quality of the communication layer may be improved, and the electrical performance of the schottky barrier rectifier may thus be improved. In addition, in this embodiment, by providing a cathode trench, the interference to the field strength at the schottky barrier may be further reduced, so that the electrical performance of the devices may be improved.

Embodiment 3

Figure 5:
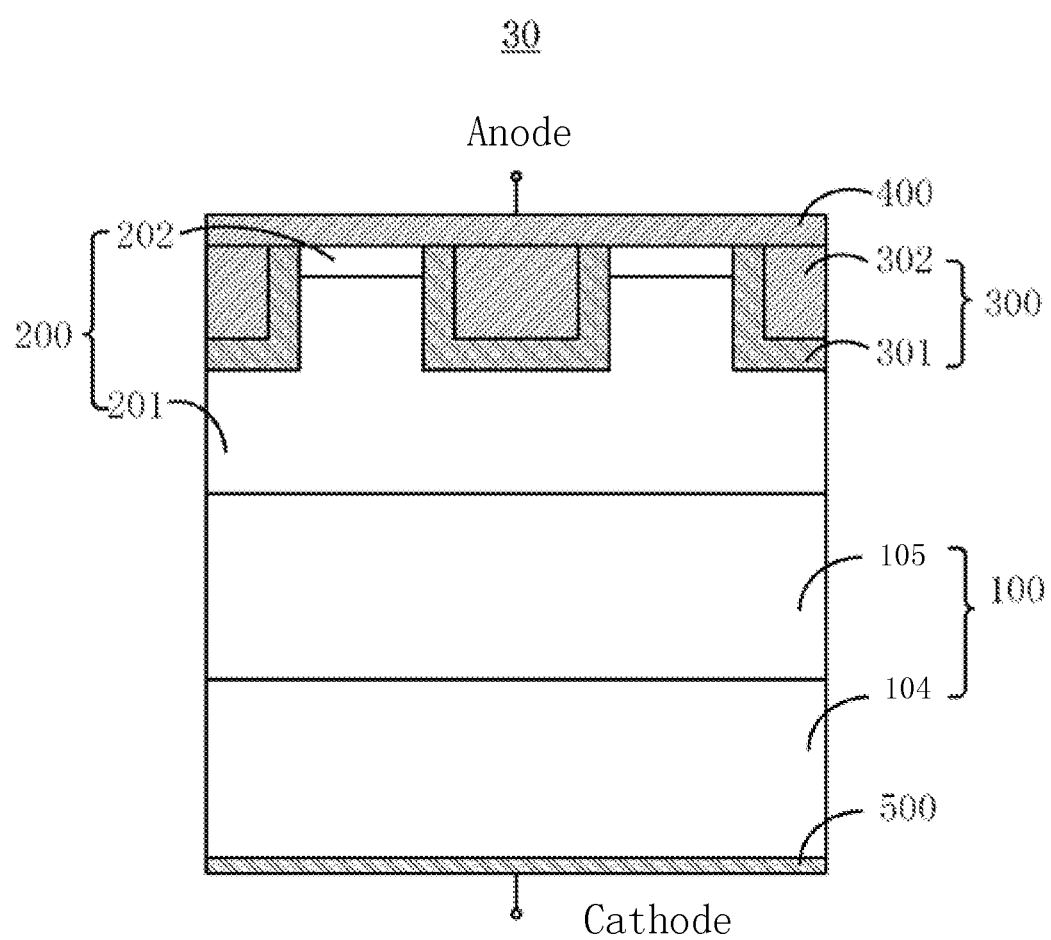
FIG. 5 is a schematic structure diagram of another schottky barrier rectifier according to the second embodiment of the present disclosure.

During the actual manufacturing of devices, in order to solve the problem of high defect intensity in the heavily-doped N-type GaN, for example, a layer of lightly-doped N-type GaN may be introduced between an AlGaN layer and an N-type GaN layer. In order to maintain the stress and improve the crystallization performance on the surface of the semiconductor material which forms the schottky contact, for example, a capping layer may be introduced into the drift layer 200. The Embodiment 3 in the present disclosure is another variant of the Embodiment 1, and the structure of the Embodiment 3 is shown in FIG. 5. Also, a schottky barrier rectifier 30 includes a communication layer 100, a drift layer 200, a metal oxide trench 300, anode metal 400 in schottky contact with the drift layer 200, and cathode metal 500 in Ohm contact with the communication layer 100. The main variance in the Embodiment 3 with respect to the Embodiment 1 lies in the specific structures of the communication layer 100 and the drift layer 200.

The communication layer 100 in this embodiment includes a substrate 104 and an epitaxial layer 105. For example, the substrate 104 forms Ohm contact with the cathode metal 500, and the epitaxial layer 105 is arranged on a side of the substrate 104 away from the cathode metal 500. Under such as case, the epitaxial layer 105 forms a heterojunction structure together with the drift layer 200.

It can be understood that, in this embodiment, the substrate 104 can not only be an N-type doped GaN substrate, but also may be obtained by heterogeneous epitaxy of a non-GaN substrate. For example, the non-GaN substrate may be made of any one of sapphire, SiC, Si, LiNbO$_3$, SOI or AlN. In this case, the GaN layer obtained by heterogeneous epitaxy of anon-GaN substrate, for example, may also be N-type doped GaN. As described above, if the non-GaN substrate is used in the structure of the aforementioned substrate 104, after the structure of the front side of the device is formed, this heterogeneous substrate is to be removed by thinning, so that the cathode metal 500 is deposited on the exposed heavily-doped N-type GaN substrate. The substrate 104 may have a thickness of 1 μm to 1 cm and a doping concentration of $10^{10}$ cm$^{-3}$ to $10^{23}$ cm$^{-3}$. In this embodiment, the substrate 104 is an N-type GaN substrate, and has a doping concentration of $10^{19}$ cm$^{-3}$.

The epitaxial layer 105 may be a lightly-doped GaN epitaxial layer. For example, the epitaxial layer 105 has a thickness of 100 nm to 10 μm and a doping concentration of $10^{10}$ cm$^{-3}$ to $10^{23}$ cm$^{-3}$.

The drift layer 200 includes a charge layer 201 close to the epitaxial layer 105 and a capping layer 202 away from the epitaxial layer 105. The epitaxial layer 105 forms a heterojunction structure together with the charge layer 201. As described above, by introducing a capping layer 202, stress on the surface of the semiconductor material may be maintained and the crystallization performance on the surface of the semiconductor material forming the schottky contact may be improved.

The charge layer 201 forms a heterojunction structure together with the epitaxial layer 105 located on a side thereof. For example, the charge layer 201 may be made of AlGaN. For example, the charge layer 201 may have a thickness of 100 nm to 100 μm and a doping concentration of $10^{10}$ cm$^{-3}$ to $10^{23}$ cm$^{-3}$. As described above, the Al component x in Al$_x$Ga$_{1-x}$N may be changed in the direction of thickness according to any modulation function, and this will not be repeated here.

For example, the capping layer 202 may be made of any one or a combination of GaN, AlGaN and InGaN. For example, the capping layer 202 may be a single-layer structure or a multi-layer structure. For example, the capping layer 202 may have a thickness of 1 nm to 10 um and a doping concentration of $10^{10}$ cm$^{-3}$ to $10^{23}$ cm$^{-3}$. By providing the capping layer 202, the surface appearance of the semiconductor crystals to may be optimized.

In conclusion, the present disclosure provides a GaN-based schottky barrier rectifier. Compared with the prior art, the embodiments of the present disclosure at least have the following advantages.

With regard to the schottky barrier rectifier in the embodiments of the present disclosure, by changing the Al component in the AlGaN material in the direction of thickness, a polarized charge area is generated inside the drift layer, so that the voltage withstanding performance of the rectifier may be improved.

With regard to the schottky barrier rectifier in the embodiments of the present disclosure, conduction is realized by carriers generated by the ionization of polarized charges without activation energy. Accordingly, the schottky barrier rectifier may operate at a relatively low temperature.

With regard to the schottky barrier rectifier in the embodiments of the present disclosure, by a metal oxide trench design, a position in the drift layer having the strongest electric field when a reverse voltage is withstood is shifted from the schottky barrier to the bottom of the trench. In this way, the voltage withstanding performance of the rectifier is improved. In addition, by modulating the Al component in the AlGaN/GaN heterojunction in the direction of thickness, the charges generated by the polarization is distributed gradiently in the direction of thickness. As a result, the distribution of the electric field in the drift layer becomes smooth, and the breakdown voltage of the rectifier is further improved.

The above descriptions are merely preferred embodiments of the present disclosure and not intended to limit the present disclosure. For those skilled in the art, various modifications and changes may be made to the present disclosure.

What is claimed is:
1. A schottky barrier rectifier, comprising:
a communication layer;
a drift layer provided on a side of the communication layer, a heterojunction structure being formed between the drift layer and the communication layer;
anode metal provided on a side of the drift layer away from the communication layer; and cathode metal provided on a side of the communication layer away from the drift layer;
wherein the drift layer is provided with a first area, which extends in a direction of thickness thereof, between a surface of the drift layer away from the communication layer and a surface thereof close to the communication layer, wherein the first area contains a first metal element and a content of the first metal element in the first area changes in the direction of thickness; and
the drift layer has a thickness of 100 nm to 100 µm.

2. The schottky barrier rectifier according to claim 1, wherein the content of the first metal element in the first area decreases from a side away from the communication layer to a side close to the communication layer.

3. The schottky barrier rectifier according to claim 1, wherein the content of the first metal element in the drift layer decreases from a side away from the communication layer to a side close to the communication layer.

4. The schottky barrier rectifier according to claim 3, wherein the content of the first metal element in the drift layer decreases in a n-order curve from the side away from the communication layer to the side close to the communication layer, wherein, n is a positive integer.

5. The schottky barrier rectifier according to claim 4, wherein the n-order curve is a quadratic curve or a cubic curve.

6. The schottky barrier rectifier according to claim 1, wherein a material of the drift layer comprises AlGaN and the first metal element is an Al element; or, a material of the drift layer comprises InGaN and the first metal element is an In element.

7. The schottky barrier rectifier according to claim 1, wherein the drift layer is made of AlGaN having a chemical formula of $Al_xGa_{1-x}N$, the first metal element is an Al element, and a depth from a side away from the communication layer toward the communication layer is y; and, x and y satisfy the following function: $x=-ay^n+b$, where, a and b are constants greater than zero, n is greater than 1, and x ranges from 0 to 1.

8. The schottky barrier rectifier according to claim 1, further comprising a first trench provided on the side of the drift layer away from the communication layer.

9. The schottky barrier rectifier according to claim 8, further comprising filling material provided inside the first trench and being the same as the anode metal.

10. The schottky barrier rectifier according to claim 9, further comprising an oxide liner layer provided between the trench and the filling material.

11. The schottky barrier rectifier according to claim 10, wherein the oxide liner layer is made of silicon oxide.

12. The schottky barrier rectifier according to claim 8, further comprising filling material arranged inside the first trench, the filling material being any one or a combination of Ti, Al, Ni, W, Au, Ag, Pt, Pb and TiN.

13. The schottky barrier rectifier according to claim 1, wherein the communication layer comprises a substrate, a buffer layer provided on a side of the substrate away from the cathode metal and a channel layer provided on a side of the buffer layer away from the substrate, and the channel layer forms the heterojunction structure together with the drift layer.

14. The schottky barrier rectifier according to claim 13, further comprising a second trench running through the drift layer, the channel layer and the buffer layer, wherein a metal wiring layer which electrically connects the communication layer and the substrate is provided inside the second trench.

15. The schottky barrier rectifier according to claim 14, further comprising an isolation filling layer provided inside the second trench and covering the metal wiring layer, wherein the drift layer and the metal wiring layer are isolated by the isolation filling layer.

16. The schottky barrier rectifier according to claim 1, wherein the communication layer comprises a substrate close to the cathode metal and an epitaxial layer close to the drift layer.

17. The schottky barrier rectifier according to claim 16, wherein the epitaxial layer is made of lightly-doped GaN.

18. The schottky barrier rectifier according to claim 17, wherein a side of the substrate close to the epitaxial layer is made of N-type doped GaN.

19. The schottky barrier rectifier according to claim 16, wherein the drift layer comprises a charge layer close to the epitaxial layer and a capping layer away from the epitaxial layer.

20. The schottky barrier rectifier according to claim 19, wherein the charge layer is made of AlGaN, and the capping layer is a single-layer structure or a multi-layer structure consisting of any one or a combination of GaN, AlGaN, InGaN and AlN.

* * * * *